US012604441B2

(12) United States Patent
Gradinger et al.

(10) Patent No.: US 12,604,441 B2
(45) Date of Patent: Apr. 14, 2026

(54) ELECTRONIC CONVERTER DESIGNED ON THE BASIS OF WELDING TECHNOLOGIES

(71) Applicants: AUDI AG, Ingolstadt (DE); Hitachi Energy Ltd, Zürich (CH)

(72) Inventors: Thomas Gradinger, Aarau Rohr (CH); David Baumann, Schafisheim (CH); Chunlei Lui, Oberrohrdorf (CH); Daniele Torresin, Baden (CH)

(73) Assignees: AUDI AG, Ingolstadt (DE); HITACHI ENERGY LTD, Zürich (CH)

( * ) Notice: Subject to any disclaimer, the term of this patent is extended or adjusted under 35 U.S.C. 154(b) by 826 days.

(21) Appl. No.: 17/435,547

(22) PCT Filed: Feb. 27, 2020

(86) PCT No.: PCT/EP2020/055141
§ 371 (c)(1),
(2) Date: Sep. 1, 2021

(87) PCT Pub. No.: WO2020/178133
PCT Pub. Date: Sep. 10, 2020

(65) Prior Publication Data
US 2022/0046830 A1 Feb. 10, 2022

(30) Foreign Application Priority Data
Mar. 4, 2019 (DE) ..................... 10 2019 202 903.5

(51) Int. Cl.
*H05K 7/20* (2006.01)
*H01L 21/48* (2006.01)
(Continued)

(52) U.S. Cl.
CPC ..... *H05K 7/20927* (2013.01); *H01L 21/4882* (2013.01); *H01L 23/473* (2013.01); *H01L 25/50* (2013.01)

(58) Field of Classification Search
CPC ... H01L 23/473; H01L 21/4882; H01L 23/10; H01L 25/50; H05K 7/20927; Y10T 29/49144
See application file for complete search history.

(56) References Cited

U.S. PATENT DOCUMENTS 6,473,303 B2 10/2002 Kaufmann
6,588,647 B2 * 7/2003 Yamada ............. H05K 7/20872
165/170

(Continued)

FOREIGN PATENT DOCUMENTS

CN 104425406 A 3/2015
DE 102006009978 B4 12/2008
(Continued)

OTHER PUBLICATIONS

Office Action issued on Aug. 17, 2023, in corresponding Chinese Application No. 202080018381.X, 10 pages.

(Continued)

*Primary Examiner* — Dale E Page
*Assistant Examiner* — Abbigale A Boyle
(74) *Attorney, Agent, or Firm* — Maier & Maier, PLLC

(57) ABSTRACT

A converter including a semiconductor module and a cooling housing. The semiconductor module includes a semiconductor chip, a substrate having a first side and a second side, a base plate having a first side and a second side, and a molding compound. The semiconductor chip connects to the first side of the substrate. The second side of the substrate connects to the first side of the base plate, the second side of the base plate has a first region and a second region. The first region has a surface expansion, and the first region having the surface expansion contacts with a coolant liquid in an operating state. The second region forms a closed path around the first region, the cooling housing has a plate (Continued)

(Section B-B)

including at least one hole, and the plate is connected around the hole to the second region of the base plate by welding.

14 Claims, 5 Drawing Sheets

(51) Int. Cl.
  H01L 23/473     (2006.01)
  H01L 25/00     (2006.01)

(56)           References Cited

U.S. PATENT DOCUMENTS

| | | | | |
|---|---|---|---|---|
| 6,594,149 | B2 | 7/2003 | Yamada et al. | |
| 7,813,133 | B2 * | 10/2010 | Iijima | H01L 23/3675 |
| | | | | 428/210 |
| 8,369,090 | B2 * | 2/2013 | Chester | G06F 1/20 |
| | | | | 165/80.4 |
| 2001/0017763 | A1 | 8/2001 | Kaufmann | |
| 2013/0285234 | A1 * | 10/2013 | Uhlemann | H01L 23/473 |
| | | | | 257/782 |
| 2015/0061112 | A1 * | 3/2015 | Bogen | H01L 23/3672 |
| | | | | 257/714 |

FOREIGN PATENT DOCUMENTS

| | | | |
|---|---|---|---|
| DE | 102013109589 | B3 | 3/2015 |
| DE | 112016001221 | T5 | 12/2017 |
| EP | 1124259 | B1 | 2/2009 |
| EP | 3276657 | A1 | 1/2018 |

OTHER PUBLICATIONS

German Examination Report issued on Feb. 1, 2021 in corresponding German Application No. 10 2019 202 903.5; 20 pages; Machine translation attached.

International Search Report (with English translation) and Written Opinion (with Machine translation) issued on May 18, 2020 in corresponding International Application No. PCT/EP2020/055141; 23 pages.

International Preliminary Report on Patentability issued on May 26, 2021 in corresponding International Application No. PCT/EP2020/055141; 17 pages.

* cited by examiner (Section A-A)

(Section B-B)

ELECTRONIC CONVERTER DESIGNED ON THE BASIS OF WELDING TECHNOLOGIES

FIELD

The present invention relates to a converter comprising a semiconductor module and a cooling housing, wherein the semiconductor module comprises a semiconductor chip, a substrate having a first and a second side, a base plate having a first and a second side, and a molding compound.

BACKGROUND

Soldering a module embedded using resin in a shared base plate or a shared cooler is known in the prior art.

A liquid-cooled circuit device is known from the document U.S. Pat. No. 6,594,149 B2, having a module having a circuit element and a module base plate, on the surface of which the circuit element is mounted, a circuit housing for housing the module, and a coolant liquid chamber for the flow of a coolant liquid in contact with a rear side of the module base plate of the module. The module base plate of the module is fitted in an opening which is provided in an element forming the coolant liquid chamber, and is welded without a gap.

A cooling device for a high-performance semiconductor module is known from the document U.S. Pat. No. 6,473, 303 B2, which has a cooler lower part and a cooler upper part, wherein the cooler upper part is connected to the cooler lower part via a materially-bonded connection. The cooler upper part has a cooling plate made of metal matrix composite material, on which at least one semiconductor component can be attached. A metal edge is formed on the cooling plate to enable a materially-bonded connection between the cooler upper part and the cooler lower part.

Creating a power semiconductor module having at least one semiconductor unit and having a base plate as a carrier is known from the document DE 10 2006 009 978 B4. The respective semiconductor unit consists of a substrate having an upper side and a lower side. At least one semiconductor unit is provided on the upper side of the substrate. The base plate in turn has its upper side, on which the respective semiconductor unit is attached with its lower side, thus with the lower side of the respective substrate of the semiconductor unit.

SUMMARY

It is the object of the present invention to provide a device which enables molded and sintered compact half-bridge modules to be housed in a six-pack configuration in a closed cooler.

The subject matter of the present invention is a converter comprising at least one semiconductor module and a cooling housing, wherein the at least one semiconductor module comprises a semiconductor chip, a substrate having a first side and a second side, a base plate having a first side and a second side, and a molding compound or potting compound.

According to the invention, the semiconductor chip is connected to the first side of the substrate, wherein the second side of the substrate is connected to the first side of the base plate, wherein the second side of the base plate has a first region and a second region, wherein the first region has a surface expansion in the form of a cooling structure, for example, implemented by cooling ribs and/or cooling pins, wherein the first region having the surface expansion is in direct contact with a coolant liquid, which flows through the cooling structure, in an operating state, wherein the second region forms a closed path around the first region, wherein the cooling housing has a plate comprising at least one hole, wherein the plate is connected around the hole to the second region of the base plate by welding.

The present invention enables the integration of three semiconductor modules, in particular single half-bridge modules, in a shared plate by welding technologies and welding on a cover to produce a cooling path or a fluid trough. The welding process does not impair the functionality of the semiconductor modules and enables a sealed container to be created without the use of an O-ring or screws. A compact solution having high reliability and high temperature resistance can thus be achieved.

The substrate is generally sintered. The substrate is configured to accommodate a base plate.

The base plate of a semiconductor module is configured and designed to be weldable to a plate, in particular a metal plate. In one refinement, the plate has a six-pack configuration having three (assembled) half-bridge modules comprising a total of six semiconductor switches. The plate comprising at least one semiconductor module is configured to be closable by a cover. The plate comprising the at least one semiconductor module and the cover are configured to form a cooling path in the assembled state. The cooling path is configured to guide a coolant fluid. In general, a converter according to the invention comprises three semiconductor modules, in particular half-bridge modules.

To connect the base plate and the plate, the welding can be laser welding. Maximum temperature and temperature-related mechanical tensions are thus limited. To connect the plate to a cover, the welding can be laser welding, friction stir welding, or arc welding, in particular CMT welding. CMT stands for cold metal transfer and is a special arc welding method.

In general, the base plate and the plate comprise the same material, wherein the usable welding technologies can be different. The base plate and the plate can optionally comprise different aluminum alloys. Laser welding offers the advantage that it is unpressurized and very fast and does not have a high welding temperature. Laser welding is particularly advantageous for the connection of the semiconductor modules to the plate.

Friction stir welding and CMT welding are particularly advantageous to connect the plate to the cover, since the requirements for a maximum temperature and mechanical strain are lower than in the connection of the semiconductor modules to the plate.

The base plate generally comprises a material which is usable with one of the selected welding technologies to achieve a required leak-tightness for the coolant liquid. The material is to offer the best possible compromise between thermal performance, reliability, corrosion resistance, and weldability.

In general, the base plate has a surface composition which does not require a coating for the galvanic corrosion protection (for example nickel) if the base plate is arranged in a cooling circuit. For example, the base plate is formed as a copper/aluminum plate. The base plate has an aluminum-coated region here, which is configured to come into contact or be in contact with a coolant medium, in particular a coolant fluid. A base plate formed from aluminum or coated using aluminum in the regions coming into contact with coolant fluid offers the advantage that it generally does not require surface finishing or further coating as a corrosion protection. In contrast, copper is generally coated using nickel for a contact with a coolant fluid.

Alternatively, the base plate is formed from AlSiC, wherein the base plate has regions enriched with aluminum in the welding regions.

The cover comprises at least one inlet and outlet opening to form a cooling path.

In one refinement of the invention, the plate is formed from aluminum or an aluminum-based alloy.

In one embodiment, the base plate is formed from AlSiC having an aluminum-rich zone on the second region, which facilitates the usability. Alternatively, the base plate consists of copper coated using aluminum.

In one refinement, the second side of the base plate comprises an edge and the second region forms a head or an attachment of the edge. The edge offers the advantage that the distance between a weld seam or at least one weld point of the weld seam and a semiconductor chip is increased. A greater distance between a weld seam and a semiconductor chip offers greater flexibility in the selection of the welding technology. A welding technology can be laser welding or friction stir welding, also in a superimposed or combined embodiment. A laser beam device or a friction stir welding device has to penetrate the plate thickness to reach the connecting point between plate and base plate. Alternatively, arc welding, in particular CMT welding, can be used as a welding technology, in that a connecting material is applied to a connecting point between plate and base plate.

In one refinement, the edge is formed as a shoulder, wherein in each case one shoulder is formed in a second region of the second side of the base plate, wherein at least one shoulder is formed aluminum coated. The material of the base plate is generally configured to be weldable. To avoid the occurrence of brittle intermetallic phases, material of the base plate is aluminum at the weld point or at respective weld points.

In one embodiment, the semiconductor chip and the substrate are embedded in a molding compound by means of epoxy resin.

The subject matter of the invention is also a method for producing an above-described converter comprising at least one semiconductor module and a cooling housing, wherein the at least one semiconductor module comprises a semiconductor chip, a substrate having a first side and a second side, a base plate having a first side and a second side, and a molding compound.

According to the invention, the at least one semiconductor module is introduced into a plate in a first step. A semiconductor module is a single half-bridge module. In general, three semiconductor modules are introduced into a shared plate.

In a further step, the second side of the base plate of the at least one semiconductor module is welded to the plate. In general, three extrusion-coated semiconductor modules having sintered substrates are welded onto a shared plate, in particular an aluminum plate. The welding is carried out from the side of the coolant medium, the second side of the base plate, since the first side of the base plate is not accessible due to the molding compound.

In a further step, a cover is applied to the plate. The cover is welded to the plate.

Subsequently, the cover is welded to the plate and a cooling path is formed. A coolant fluid flows through the cooling path through at least one inlet and outlet opening.

BRIEF DESCRIPTION OF THE FIGURES

The invention is schematically shown on the basis of embodiments in the drawing and will be described in more detail with reference to the drawing, wherein identical components are identified by identical reference numerals. In the figures.

DETAILED DESCRIPTION

Figure 1:
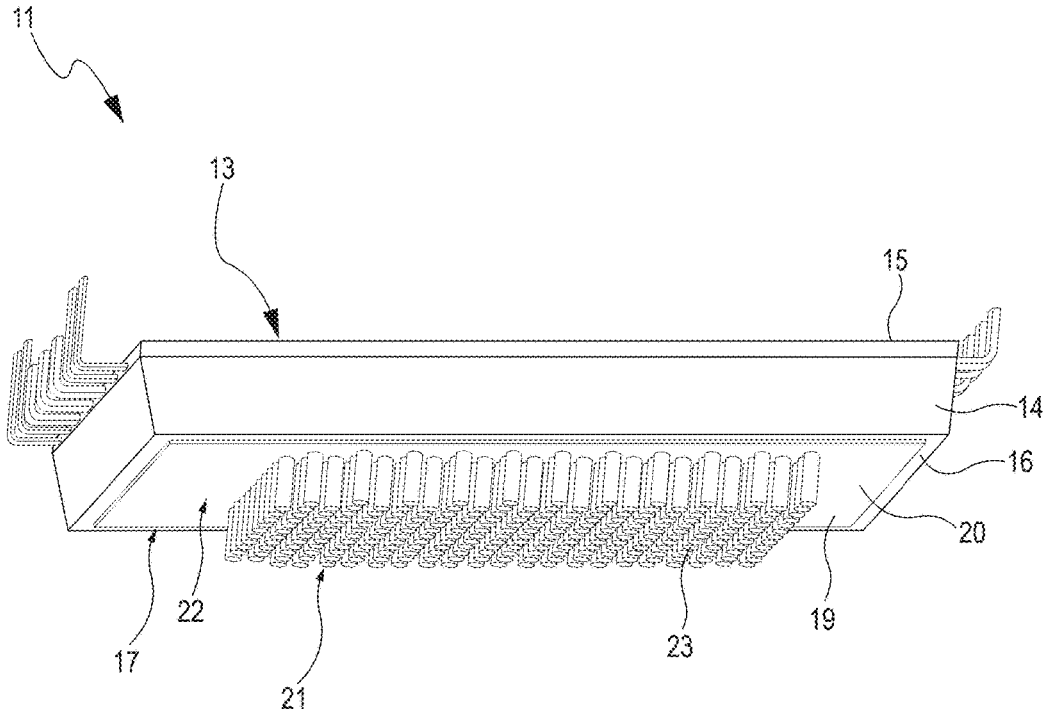
FIG. 1 shows a perspective view of an embodiment of a semiconductor module according to the invention, designed as a single half-bridge module.

FIG. 1 shows a perspective view of an embodiment of a semiconductor module 11 according to the invention, designed as a single half-bridge module. The semiconductor module 11 comprises a semiconductor chip 13, a substrate 14 having a first side 15 and a second side 16, a base plate 17 having a first side 18 (not visible here) and a second side 19, and a molding compound 20.

The semiconductor chip 13 is connected to the first side 15 of the substrate 14, wherein the second side 16 of the substrate 14 is connected to the first side 18 of the base plate 17.

The second side 19 of the base plate 17 has a first region 21 and a second region 22. The first region 21 has a surface expansion 23 in the form of cooling ribs 23. The first region 21 having the surface expansion 23 is in direct contact with a coolant liquid in an operating state, wherein the second region 22 forms a closed path around the first region 21 in the closed state in a converter.

Figure 2:
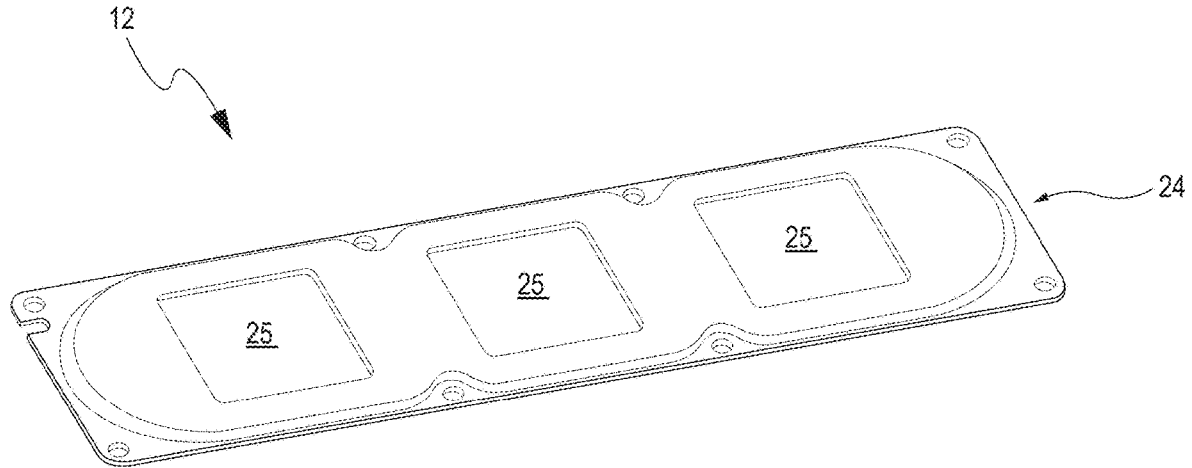
FIG. 2 shows a perspective view of a plate of a cooling housing of one embodiment of the converter according to the invention.

FIG. 2 shows a perspective view of a plate 24 of a cooling housing 12 of an embodiment of the converter according to the invention. The plate 24 has three passages 25, which are each configured to accommodate the semiconductor module 11 shown in FIG. 1a. The plate 24 is formed from aluminum or an aluminum-based alloy, wherein the plate 24 is connected, in a state joined with the semiconductor modules 11, around the passage 25 to the second region 22 of the base plate 17 by welding.

5

Figure 3A:
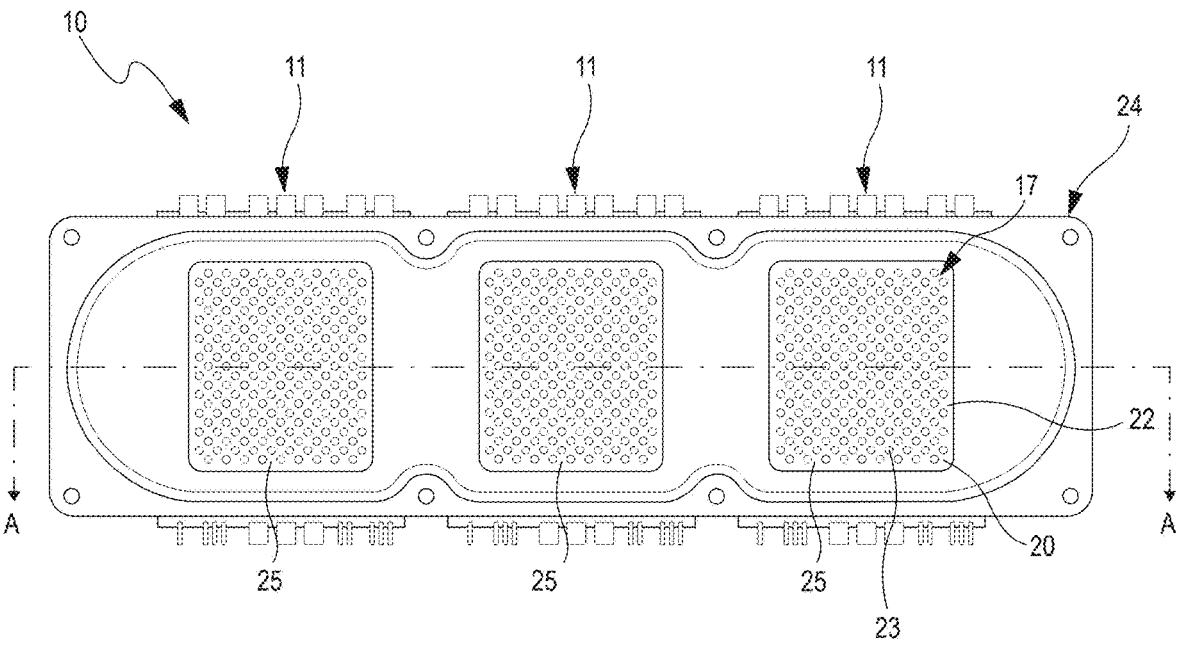
FIG. 3A shows a top view of three single half-bridge modules welded onto a shared plate.

FIG. 3A shows a top view of three single half-bridge modules 11 of a converter 10 welded on a shared plate 24. The three passages 25 of the plate 24 in which the single half-bridge modules 11 are accommodated are shown. The single half-bridge modules 11 are welded to the shared plate 24. A six-pack arrangement based on three separate half-bridge modules each having two semiconductor switches having injection molded and sintered substrates is thus provided.

Figure 3B:
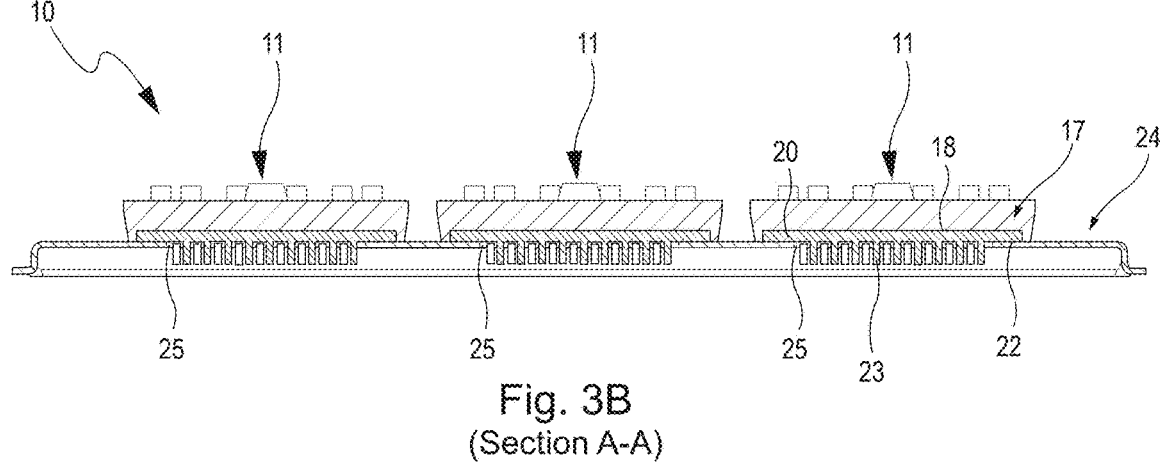
FIG. 3B shows a sectional view along line A-A of the arrangement shown in FIG. 3A of three individual bridge modules welded onto a shared plate.

FIG. 3B shows a sectional view of the arrangement— shown in FIG. 3A—of three single bridge modules 11 welded on a shared plate 24. The cooling ribs 23 protrude into the passages 25 of the plate 24.

Figure 4:
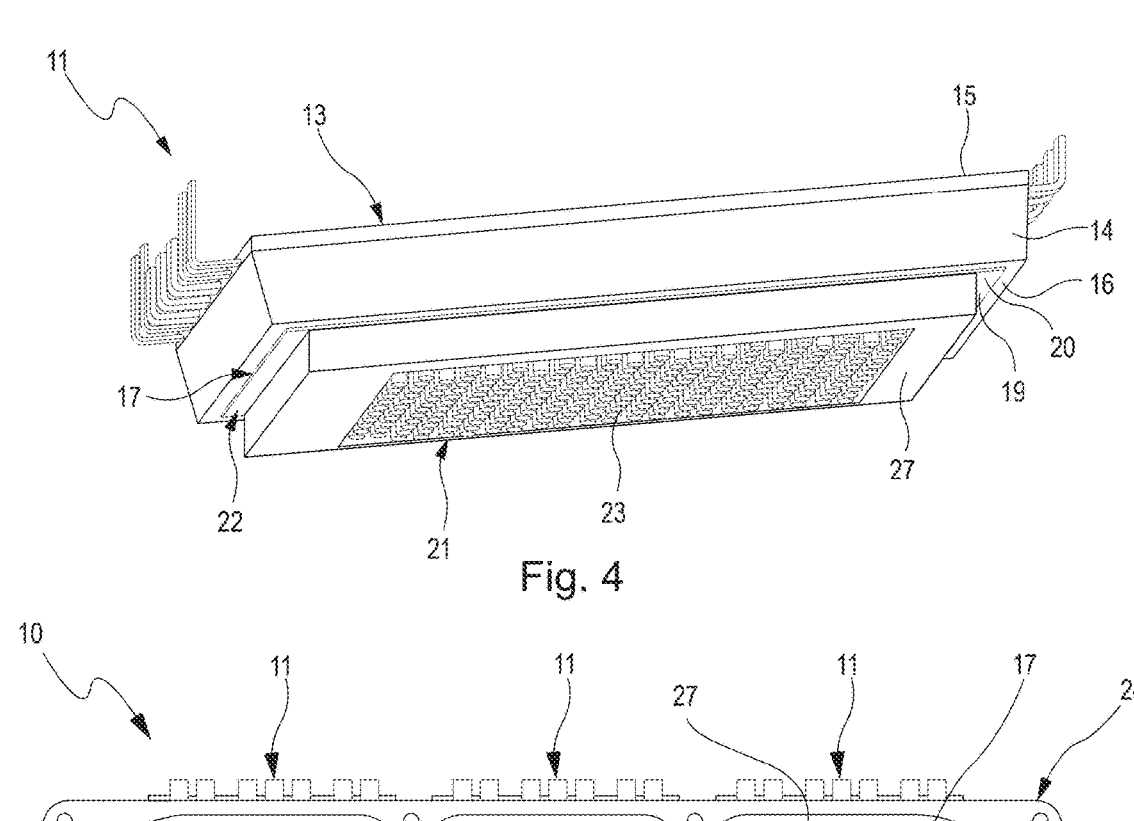
FIG. 4 shows an embodiment of a single half-bridge module according to the invention having shoulder base plate.

FIG. 4 shows a single half-bridge module 11 according to the invention having a shoulder base plate 27. The shoulder base plate 27 is formed on the second side 19 of the base plate 17. The shoulder base plate 27 has an edge 28. The edges formed on the second side 19 of the base plate 17 and the second region 22 of the second side 19 of the base plate 17 forms an attachment or a head of the edge. In the present embodiment, the edge 28 is formed as shoulders which are formed starting from the second region 22 in the same alignment as the cooling ribs 23. The shoulders 28 are formed circumferentially around the cooling ribs 23.

Figure 5A:
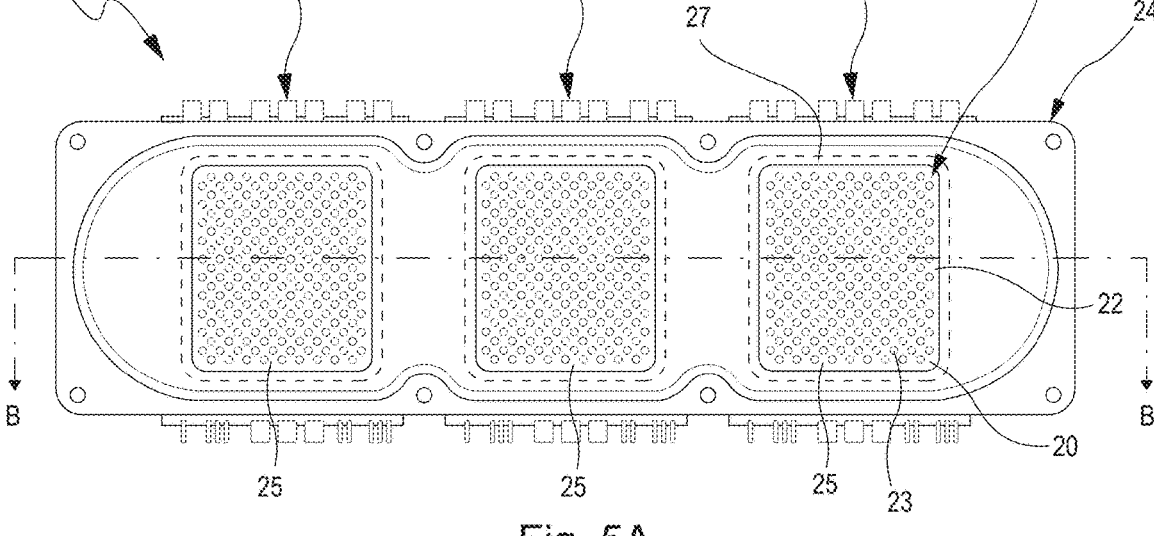
FIG. 5A shows a top view of an arrangement according to the invention of the welding of three single half-bridge modules having shoulder base plate on a shared plate.

FIG. 5A shows a top view of an arrangement according to the invention of welding of three single half-bridge modules 11—shown in FIG. 4—having shoulder base plates 27 on a shared plate 24.

Figure 5B:
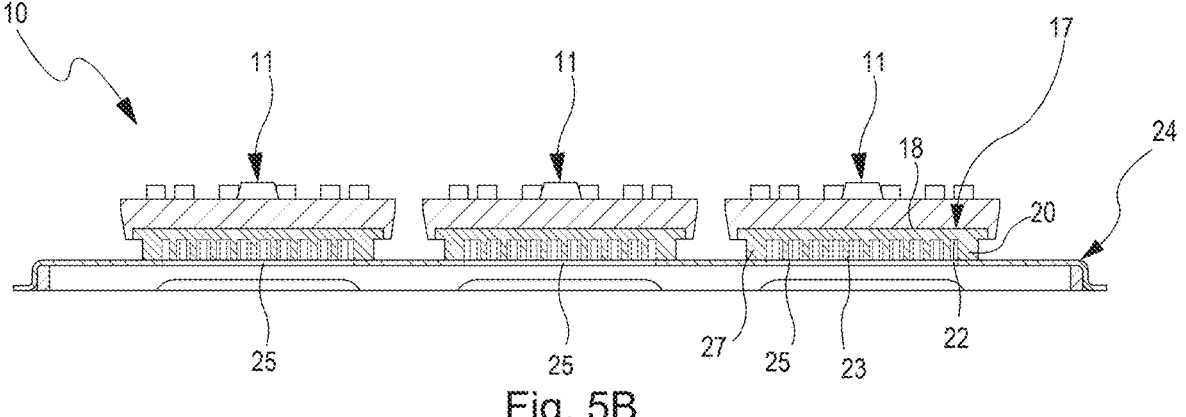
FIG. 5B shows a cross-sectional view along line B-B of the arrangement shown in FIG. 5A of the three single half-bridge modules on the shared plate.

FIG. 5B shows a cross-sectional view of the arrangement—shown in FIG. 5A—of the three single half-bridge modules 11 on the shared plate 24. The shoulder base plate 27 having the shoulders 28 is shown. Furthermore, a weld seam along which the three single half-bridge modules 11 are welded to the plate 24 is shown.

Figure 6:
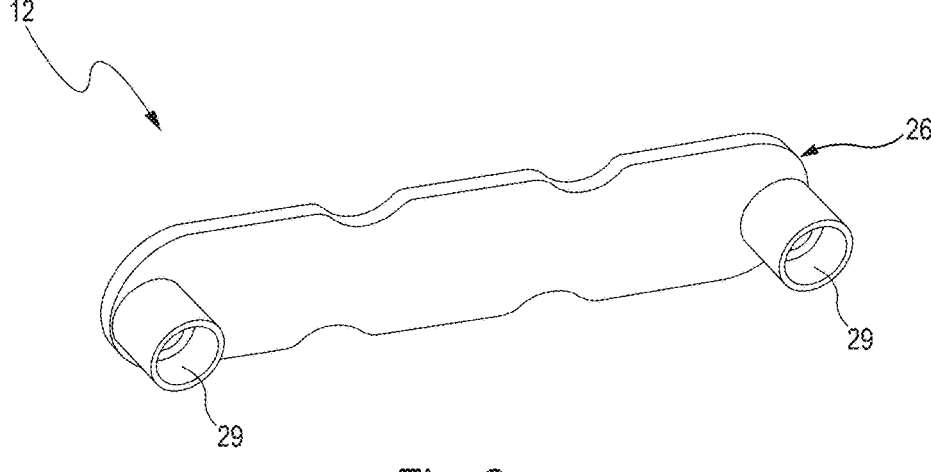
FIG. 6 shows a cover of the cooling housing of one embodiment of the converter according to the invention having an inlet and an outlet opening to form a cooling path.

FIG. 6 shows a cover 26 of the cooling housing 12 of the converter according to the invention having two inlet and outlet openings 29. By means of the inlet and outlet openings 29, a cooling path is formed when the cover 26 of the cooling housing 12 is closed. The cover 26 is welded on the plate 24 having the single half-bridge modules.

Figure 7:
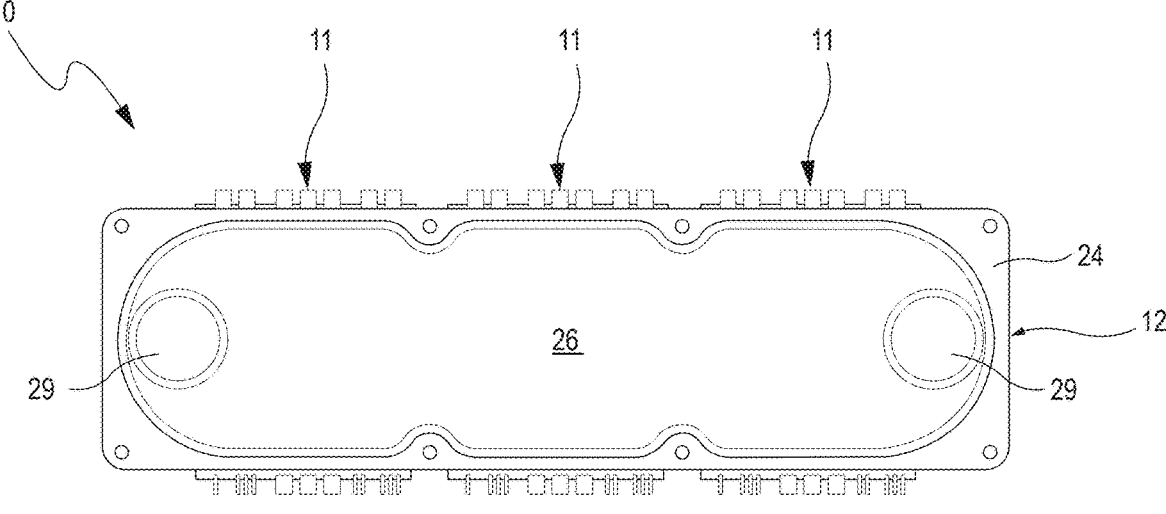
FIG. 7 shows the cover shown in FIG. 6A for covering the plate comprising the single half-bridge modules in the state placed on the plate.

FIG. 7 shows the cover 26—shown in FIG. 6A—for covering the plate 24 comprising the single half-bridge modules 11 in the state placed on the plate 24 and the welded state.

Figure 8:
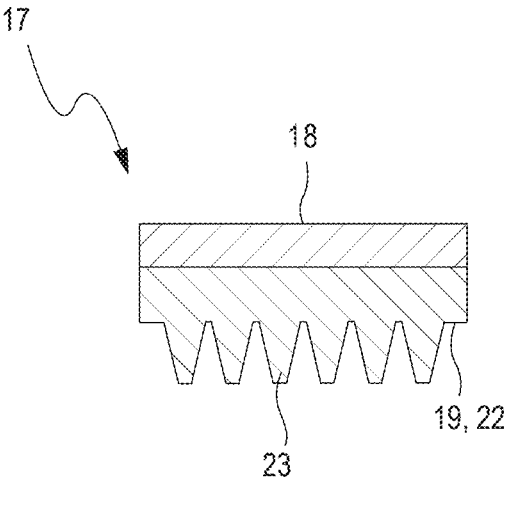
FIG. 8 shows one embodiment of the base plate of the converter according to the invention.

FIG. 8 shows an embodiment of the base plate 17 of the converter according to the invention. The base plate 17 has a first side 18 and a second side 19. The second side 19 of the base plate 17 has, in a first region 21, a surface expansion originating quasi-integrally from the second side 19 in the form of cooling ribs 23 and a second region 22 enclosing the first region 21. The first side 18 of the base plate 17 is formed from copper. The second side 19 of the base plate 17 is formed from aluminum together with the surface expansion, i.e., the cooling ribs 23 here. The base plate 17 can accordingly be designed as a copper base plate having cooling ribs, which is coated using aluminum.

Figure 9:
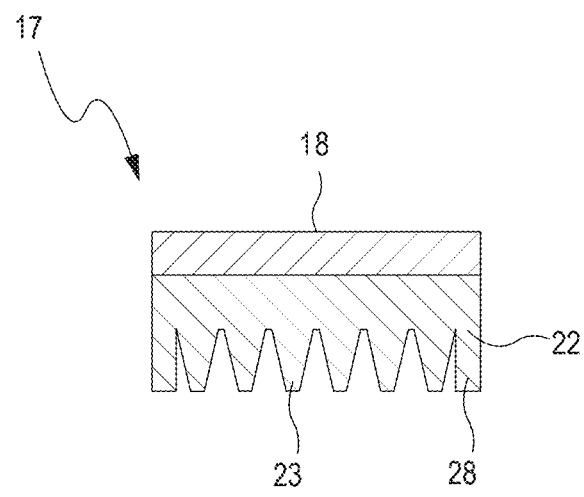
FIG. 9 shows a further embodiment of the base plate of the converter according to the invention.

FIG. 9 shows a further embodiment of the base plate 17 of the converter according to the invention. The base plate 17 has a first side 18 and a second side 19. The second side 19 of the base plate 17 has, in a first region 21, a surface expansion integrally originating from the second side 19 having a cooling structure, for example in the form of cooling ribs 23 made of aluminum here, and, in a second region 22, a shoulder base plate 27 having shoulders 28 made of aluminum. The first side 18 of the base plate 17 is formed from copper. The second side 19 of the base plate 17 is formed from aluminum together with the cooling structure, the cooling ribs 23 here, and the shoulders 28.

In the present embodiment, the shoulder base plate 27 is integrated directly into the base plate 17. The shoulder base plate 27 has shoulders 28 coated using aluminum in the second region 22 of the base plate 17. One embodiment of the base plate 17 can therefore be designed as a copper base plate, which is coated using aluminum, having cooling ribs and aluminum-coated shoulders 28.

Figure 10:
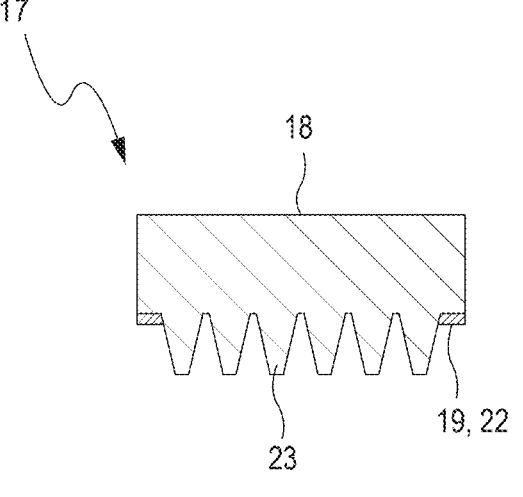
FIG. 10 shows a further embodiment of the base plate of the converter according to the invention.

FIG. 10 shows a further embodiment of the base plate 17 of the converter according to the invention. The base plate 17 has a first side 18 and a side 19. The second side 19 of the base plate 17 has, in a first region 21, a surface expansion, which is integrated into the base plate or originates from the base plate, forming a cooling structure in the form of cooling ribs 23 here, for example. The base plate 17 is formed from AlSiC (aluminum silicon carbide). The embodiment shown in Figure Sc has regions enriched with aluminum, which are identified by tight shading, in a second region 22 of the second side 19 at welding points. The occurrence of brittle intermetallic phases is avoided by the formation of the welding points in the second region 22 of the second side 19 of the base plate 17 from aluminum.

Figure 11:
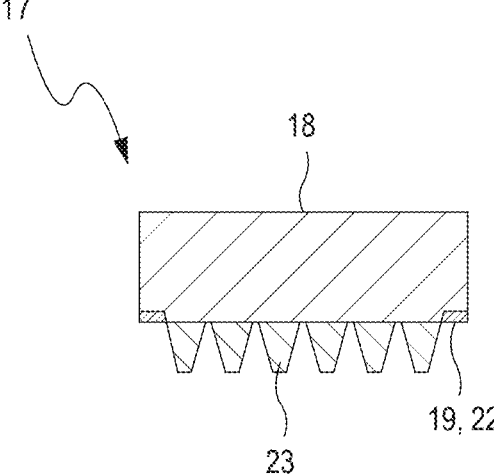
FIG. 11 shows one embodiment of a structure of a base plate according to the invention.

FIG. 11 shows an embodiment of a structure of a base plate 17 according to the invention. The base plate 17 has a first side 18 and a second side 19. A surface expansion in the form of cooling ribs 23, which is attached to the second side 19 or arranged on the second side 19, is arranged on the second side 19 in a first region 21. In a second region 22, the second side 19 of the base plate 17 has an aluminum coating, as identified by tight shading.

LIST OF REFERENCE NUMERALS

10 converter
11 semiconductor module
12 cooling housing
13 semiconductor chip
14 substrate
15 first side of the substrate
16 second side of the substrate
17 base plate
18 first side of the base plate
19 second side of the base plate
20 molding compound
21 first region of the second side 19 of the base plate
22 second region of the second side 19 of the base plate
23 cooling structure, cooling ribs
24 plate, metal plate
25 passage
26 cover
27 shoulder base plate
28 edge/shoulders
29 inlet and outlet opening

The invention claimed is:

1. A converter comprising:

at least one semiconductor module and a cooling housing, wherein the at least one semiconductor module comprises a semiconductor chip, a substrate having a first side opposite a second side, a base plate having a first side opposite a second side, and a molding compound, wherein the first side of the substrate is connected to the semiconductor chip, wherein the second side of the substrate is connected to the first side of the base plate, wherein the second side of the base plate has a first region and a second region, wherein the first region has a surface expansion in the form of a cooling structure, such that, in an operating state, the first region having the surface expansion is in direct contact with a coolant liquid, wherein the second region forms a closed path around the first region wherein the second regions extends perpendicular from the second side of the base plate in a protrusion direction to form a shoulder, wherein the cooling housing comprises a housing plate with at least one recess, and the second region of the base plate is welded to the housing plate around a corresponding one of the at least one recess, wherein the second side of the base plate comprises an edge and the second region coincides with the edge.

2. The converter as claimed in claim 1, wherein the housing plate is formed from aluminum or an aluminum-based alloy.

3. The converter as claimed in claim 1, wherein the semiconductor chip and the substrate are embedded in a molding compound by means of epoxy resin.

4. A method for producing a converter, comprising:

a) introducing at least one semiconductor module into a housing plate of a cooling housing, the at least one semiconductor module comprising a semiconductor chip, a substrate having a first side opposite a second side, a base plate having a first side opposite a second side, and a molding compound;

b) welding the second side of the base plate of the at least one semiconductor module to the housing plate;

c) applying a cover to the housing plate; and d) welding the cover to the housing plate and thus forming a cooling path, wherein the second side of the base plate comprises an edge and a second region coincides with the edge; and wherein the second region further comprises one or more sidewalls which extend perpendicular from the second side of the base plate in a protrusion direction to form a shoulder.

5. The converter as claimed in claim 1, wherein the second region is welded to the housing plate in a plane which sits aligned with a base of the cooling structure relative to a protrusion direction of the surface expansion.

6. The converter as claimed in claim 1, wherein the second region is welded to the housing plate in a plane which sits between a base and a tip of the cooling structure relative to a protrusion direction of the surface expansion.

7. The converter as claimed in claim 1, wherein the second region is welded to the housing plate in a plane which sits aligned with a tip of the cooling structure relative to a protrusion direction of the surface expansion.

8. The converter as claimed in claim 1, wherein the shoulder is aluminum coated.

9. The converter of claim 1, wherein the second region extends in the protrusion direction such that a bottom of the second region sits co-planar with a tip of the cooling structure.

10. The converter of claim 9, wherein the bottom of the second region that is co-planar with the tip of the cooling structure is welded to the housing plate.

11. The method of claim 4, wherein the second region extends in the protrusion direction such that a bottom of the second region sits co-planar with a tip of the cooling structure.

12. The method of claim 11, wherein the bottom of the second region that is co-planar with the tip of the cooling structure is welded to the housing plate.

13. The converter of claim 1, wherein the base plate is formed from aluminum silicon carbide (AlSiC) and has an aluminum-rich zone on a region corresponding to the weld between the base plate and the housing plate.

14. The method of claim 4, wherein the base plate is formed from aluminum silicon carbide (AlSiC) and has an aluminum-rich zone on a region corresponding to the weld between the base plate and the housing plate.

\* \* \* \* \*